United States Patent
Korger et al.

(10) Patent No.: US 6,798,186 B2
(45) Date of Patent: Sep. 28, 2004

(54) PHYSICAL LINEARITY TEST FOR INTEGRATED CIRCUIT DELAY LINES

(75) Inventors: Peter Korger, Frederick, CO (US); Robert W. Moss, Longmont, CO (US)

(73) Assignee: LSI Logic Corporation, Milpitas, CA (US)

( * ) Notice: Subject to any disclaimer, the term of this patent is extended or adjusted under 35 U.S.C. 154(b) by 120 days.

(21) Appl. No.: 10/141,998

(22) Filed: May 8, 2002

(65) Prior Publication Data

US 2003/0210030 A1 Nov. 13, 2003

(51) Int. Cl.[7] .............................................. G01R 23/175
(52) U.S. Cl. .................................. 324/76.54; 324/73.1
(58) Field of Search ........................... 324/76.54, 73.1, 324/765, 617, 158.1

(56) References Cited

U.S. PATENT DOCUMENTS

| | | | | |
|---|---|---|---|---|
| 5,097,208 A | * | 3/1992 | Chiang | 324/73.1 |
| 5,291,141 A | * | 3/1994 | Farwell et al. | 324/617 |
| 6,448,756 B1 | * | 9/2002 | Loughmiller | 324/76.54 |
| 6,469,493 B1 | * | 10/2002 | Muething et al. | 324/158.1 |
| 6,496,043 B1 | * | 12/2002 | Moss et al. | 327/12 |

* cited by examiner

Primary Examiner—Anjan Deb
Assistant Examiner—Timothy J. Dole
(74) Attorney, Agent, or Firm—Westman, Champlin & Kelly

(57) ABSTRACT

A method and apparatus are provided for testing linearity of two or more programmable delay chains in an integrated circuit. A first delay chain is successively programmed to a first sequence of delay settings and, for each delay setting in the first sequence, a second delay chain is successively programmed to a second sequence of delay settings. The second sequence sweeps a propagation delay through the second delay chain from a delay value less than a present propagation delay through the first delay chain to a delay value greater than the present propagation delay. For each delay setting of the second delay chain, a logic transition is applied to inputs of the first and second delay chains and the output of one of the first and second delay chains is latched as a function of the output of the other of the first and second delay chains to produce a sample value. The sample values produced for each delay setting in the first sequence are monitored to determining whether the logic transition occurs in the sample values within an expected time window.

19 Claims, 3 Drawing Sheets

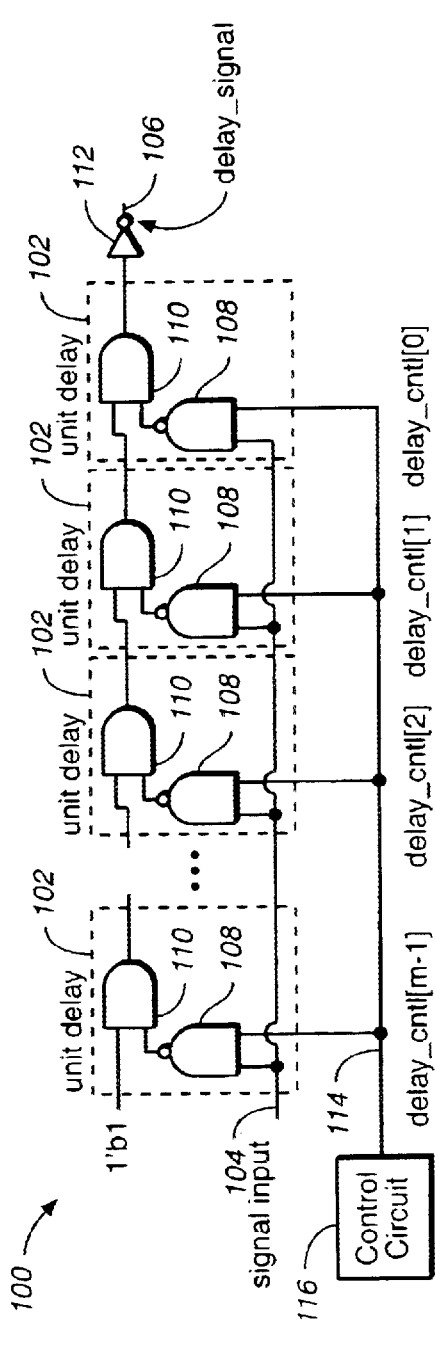
FIG._1
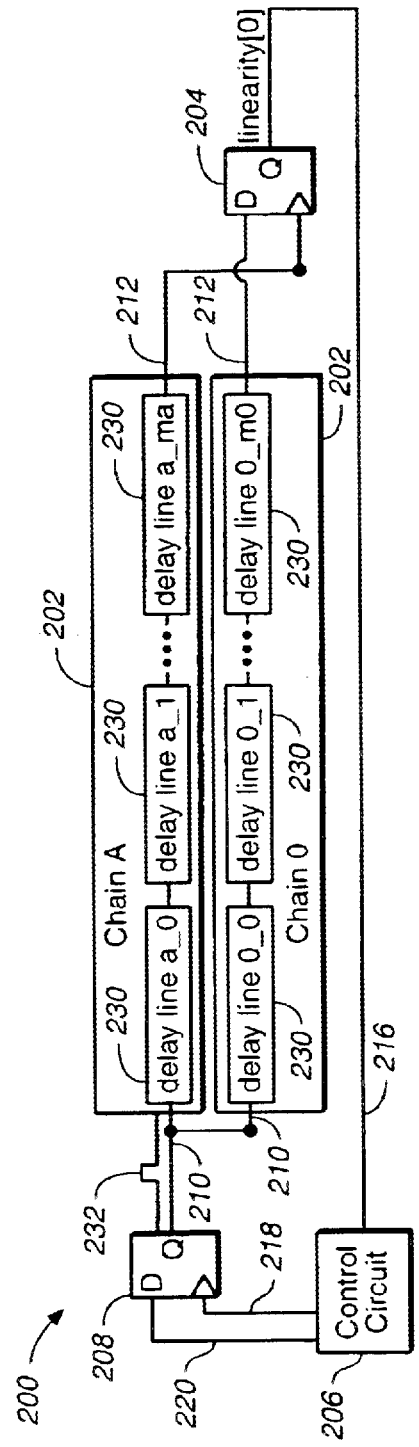
FIG._2

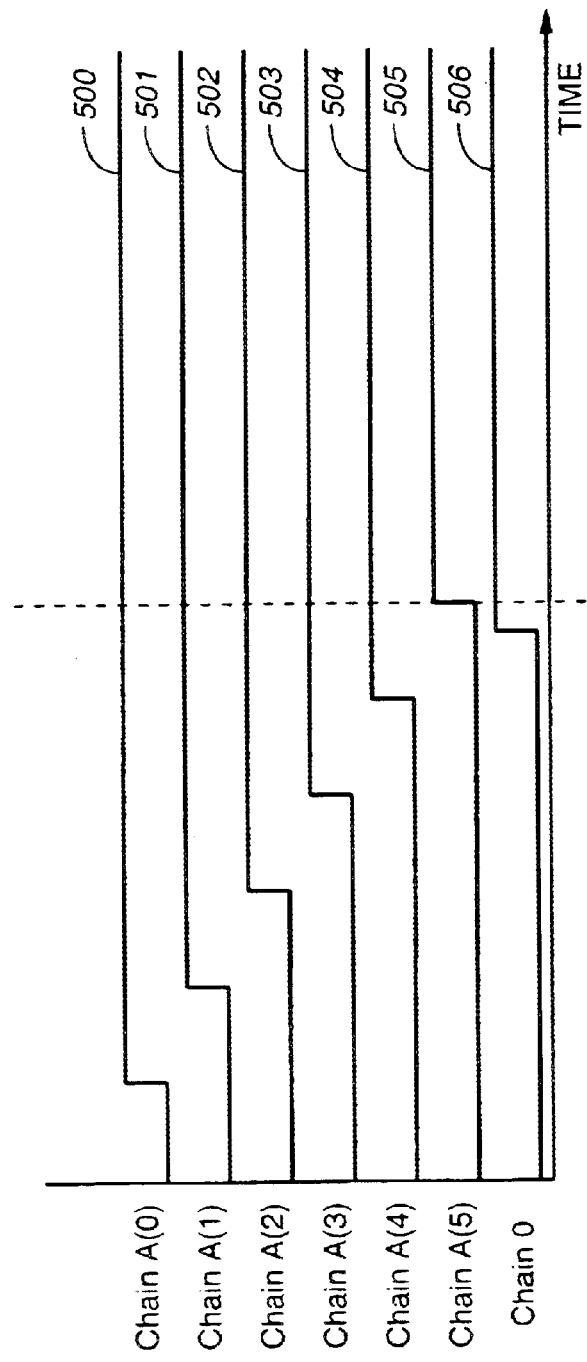
FIG._3
FIG._4

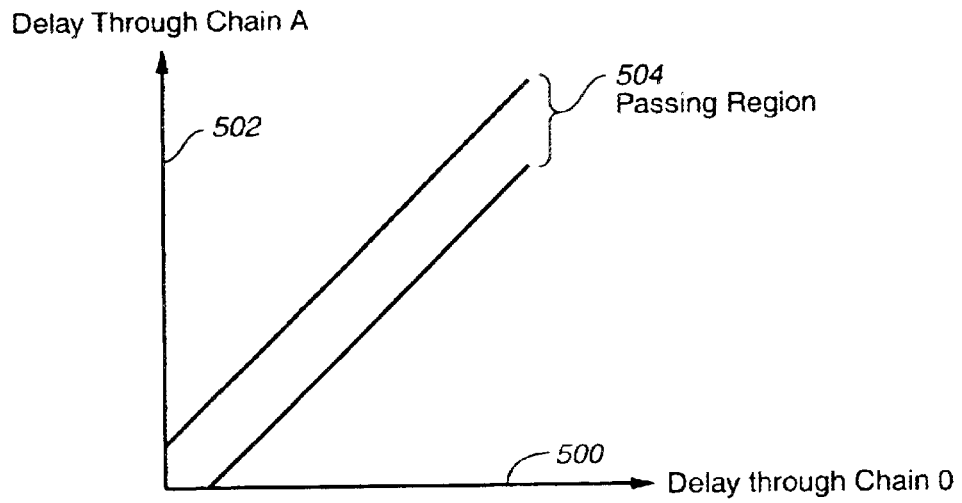
FIG._5
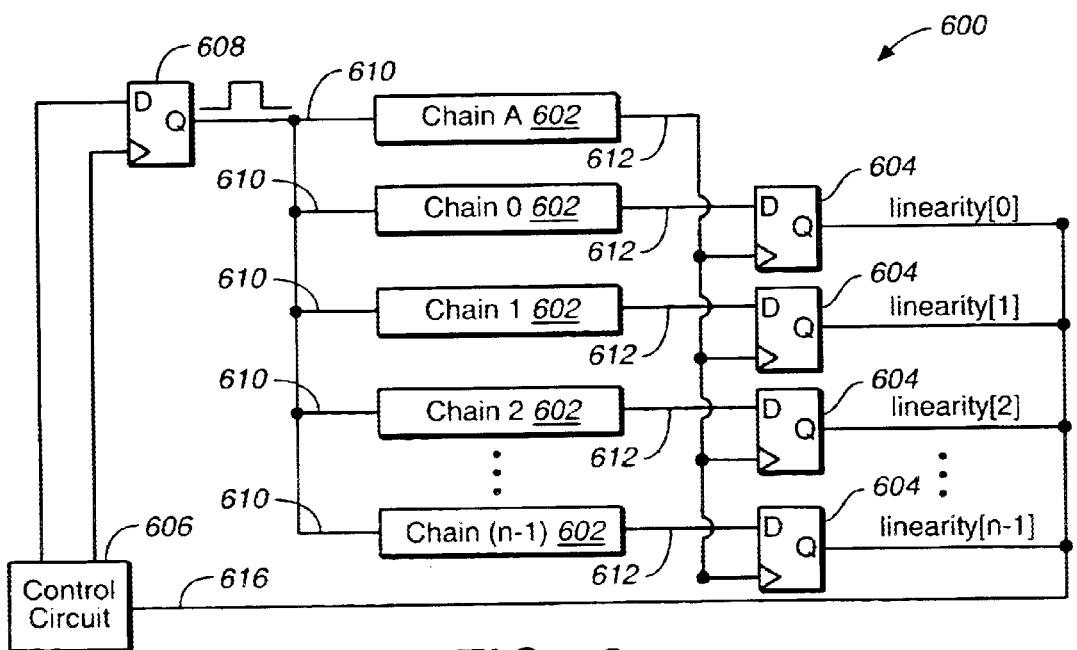
FIG._6

PHYSICAL LINEARITY TEST FOR INTEGRATED CIRCUIT DELAY LINES

FIELD OF THE INVENTION

The present invention relates to semiconductor integrated circuits and, more specifically, to test structures for testing linearity of delay lines fabricated on integrated circuits.

BACKGROUND OF THE INVENTION

Semiconductor integrated circuits often include two or more delay lines, such as one master delay line and several slave delay lines. Each delay line is typically constructed of a number of unit delays that are connected together in series. In a programmable delay line, the delay line has a control input which determines the number of unit delays through which the input signal passes.

Linearity between different delay lines on the same integrated circuit is very important for correct operation of the circuit. Linearity means that each unit delay in one delay line has the same delay as each unit delay in another delay line. If the delay lines have good linearity, the delay through one delay line increases by the same amount as the delay through another delay line for additional unit delay added to the line by the control input.

One example of a circuit in which delay lines having good linearity are needed is a delay-locked loop ("DLL") that drives one or more slave delay lines. DLLs are used in integrated circuits for removing phase differences between clocks, such as phase differences caused by propagation delay. A DLL is constructed with a master delay line and outputs a delay value. If, for example, the circuit designer wants one of the slave delay lines to have a delay equal to half a clock period, the circuit designer programs the slave delay line with the delay value divided by two. In this way, the delay through the slave delay line can be calibrated to remove variations in process, voltage and temperature since the delay value produced by the DLL varies to remove these factors. In order for this calibration to be accurate, the master delay line in the DLL must have good linearity with respect to the slave delay line. Non-linearity will consume timing margin where the output of the slave delay line is used.

In order to maximize linearity, the physical layout of the unit delays in each delay line is typically the same. Therefore, when the delay lines are fabricated, each unit delay has the same physical structure. However, fabrication tolerances can lead to variances between one unit delay and the next even though each unit delay is built with the same structure. Since linearity of delay lines is so important for the correct operation of an integrated circuit, there exists a need to test linearity of delay lines easily in a short period of time during production.

One method of testing linearity is to measure the entire delay through each delay line. However, this approach may hide linearity errors. For example if one unit delay within a delay line has a delay that is 50% larger than expected and another unit delay in the delay line has a delay that is 50% less than expected, then these two errors cancel one another and cannot be measured with the old approach. Accumulated errors can therefore hide unit delay errors with the old approach.

Improved methods and test structures are desired for testing linearity between two or more delay lines on an integrated circuit.

SUMMARY OF THE INVENTION

One embodiment of the present invention is directed to a method for testing linearity of two or more programmable delay chains in an integrated circuit. A first delay chain is successively programmed to a first sequence of delay settings and, for each delay setting in the first sequence, a second delay chain is successively programmed to a second sequence of delay settings. The second sequence sweeps a propagation delay through the second delay chain from a delay value less than a present propagation delay through the first delay chain to a delay value greater than the present propagation delay. For each delay setting of the second delay chain, a logic transition is applied to inputs of the first and second delay chains and the output of one of the first and second delay chains is latched as a function of the output of the other of the first and second delay chains to produce a sample value. The sample values produced for each delay setting in the first sequence are monitored to determining whether the logic transition occurs in the sample values within an expected time window.

Another embodiment of the present invention is directed to a delay line linearity test structure fabricated in an integrated circuit. The test structure includes first and second delay chains, a latch, a memory, a logic transition generator and a control circuit. Each delay line is programmable to a plurality of different delay settings and includes a signal input and a signal output. The latch has a data input coupled to the output of one of the first and second delay lines, a latch control coupled to the output of the other of the first and second delay lines, and a latch output. The control circuit successively programs the first delay chain to a first sequence of the delay settings. For each delay setting in the first sequence, the control circuit successively programs the second delay chain to a second sequence of the delay settings that sweep a propagation delay through the second delay chain from a delay value less than a present propagation delay through the first delay chain to a delay value greater than the present propagation delay. The logic transition generator applies a logic transition to the inputs of the first and second delay chains for each of the delay settings of the first and second delay chains. The memory is coupled to the latch output for storing a sample value produced on the latch output in response to the logic transition for each delay setting of the second delay chain. The control circuit determines whether the logic transition occurs within an expected time window in the sample values stored in the memory for each delay setting in the first sequence.

Another embodiment of the present invention is directed to a delay line linearity test structure fabricated in an integrated circuit. The test structure includes first and second delay chains, wherein each delay line is programmable to a plurality of different delay settings and includes a signal input and a signal output. A control circuit successively programs the first delay chain to a first sequence of the delay settings and successively programs the second delay chain to a second sequence of the delay settings that sweep a propagation delay through the second delay chain from a delay value less than a present propagation delay through the first delay chain to a delay value greater than the present propagation delay, for each delay setting in the first sequence. The control circuit applies a logic transition to the signal inputs of the first and second delay chains and latches the signal output of one of the first and second delay chains as a function of the signal output of the other of the first and second delay chains to produce a sample value, for each delay setting of the second delay chain. The control circuit then determines whether the logic transition occurs within an expected time window in the sample values produced for each delay setting in the first sequence.

BRIEF DESCRIPTION OF THE DRAWINGS

FIG. 1 is a schematic diagram illustrating an example of a delay line that can be used in an integrated circuit.

FIG. 2 is a schematic diagram illustrating a test structure for testing the linearity of unit delays in one delay chain relative to unit delays in another delay chain.

FIG. 3 is a table illustrating three possible arrays of captured values from the test structure shown in FIG. 2.

FIG. 4 is a timing diagram illustrating the output of one delay chain in FIG. 2 as the delay through that chain is swept from a delay that is less than the delay through a second chain to a delay that is greater than the delay through the second chain.

FIG. 5 is a graph in which the delay through the first chain is plotted against the delay through the second chain.

FIG. 6 shows a test structure which is capable of testing multiple delay chains in parallel to save tester time.

DETAILED DESCRIPTION OF ILLUSTRATIVE EMBODIMENTS

One embodiment of the present invention provides a method and apparatus for comparing two or more delay lines against one another for linearity on a unit delay basis.

FIG. 1 is a schematic diagram illustrating an example of a delay line that can be used in an integrated circuit. Delay line 100 includes a plurality of unit delays 102 which are connected in series with one another between a signal input 104 and a signal output 106. Each unit delay 102 includes a logic NAND gate 108 and a logic AND gate 110. NAND gate 108 has a first input coupled to signal input 104 and a second input 108 coupled to a respective delay control input DELAY_CNTL[m-1:0], where "m" is a variable equal to the number of unit delays 102 in delay line 100. The output of NAND gate 108 is coupled to one input of AND gate 110. In the first unit delay 102 of delay line 100, the other input of AND gate 110 is coupled to a logic high state, which is labeled "1′b1" in the figure to indicate a 1-bit binary "1" value. In the remaining unit delays 102, the other input of AND gate 110 is coupled to the output of the AND gate 110 of the next preceding unit delay 102 in delay line 100. In the last unit delay 102 in delay line 100, the output of AND gate 110 is coupled to signal output 106 (labeled "DELAY_SIGNAL") through an inverter 112. Delay control inputs DELAY_CNTL[m-1:0] are coupled to delay control output 114 of a control circuit 116.

During operation, control circuit 116 programs the propagation delay through delay line 100 by setting one of the delay control inputs DELAY_CNTL[m-1:0] to a logic high value while setting the other delay control inputs to a logic low value. This is known as a "one-hot" binary value. For example, when DELAY_CNTL [1] is high, DELAY_CNTL[m-1] to DELAY_CNTL[2] and DELAY_CNTL[0] are low, and the delay through delay line 100 is equal to the delay through two unit delays 102.

The unit delays and the control of the delay line do not have to be built as shown in FIG. 1. FIG. 1 simply shows one way of constructing and controlling a delay line. Any other delay line structure and control method can be used with the present invention as long as the delay line has a programmable delay and includes two or more unit delays connected together in series.

In a typical fabrication process, the physical layout of each of the unit delays 102 has the same structure so that the best linearity can be achieved between different delay lines on the same integrated circuit.

FIG. 2 is a schematic diagram illustrating a test structure 200 for testing the linearity of the unit delays in one delay chain relative to the unit delays in another delay chain. Test structure 200 includes two delay chains 202 (labeled "chain A" and "chain 0"), a linearity sample latch 204, a control circuit 206 and a test latch 208. Control circuit 206 and latches 204 and 208 can be internal or external to the integrated circuit on which delay chains A and 0 are fabricated. Although only two delay chains are shown in FIG. 2, test structure 200 can include any number of delay chains as discussed in more detail below with respect to FIG. 6. FIG. 2 shows delay chain A and delay chain 0 as they would be coupled during a test mode of the integrated circuit on which they are fabricated. During a normal mode as well as a test mode, delay chain A and delay chain 0 would be coupled to their associated logic (not shown) to perform their normal function. Suitable control circuitry (also not shown), such as multiplexers, can be used for switching the delay chains into and out of the test mode.

Delay chain A and delay chain 0 each have a signal input 210 and a signal output 212. Inputs 210 are coupled to the output of test latch 208. The output 212 of one of the delay chains 202 is coupled to the clock input of linearity latch 204, and the output 212 of the other delay chain 202 is coupled to the data input of linearity latch 204. In this example, output 212 of chain A is coupled to the clock input of latch 204, and output 212 of chain 0 is coupled to the data input latch 204. Delay chain A and delay chain 0 each further include two or more delay lines 230 which are coupled together in series between signal input 210 and signal output 212. In one embodiment, each delay line 230 is constructed in a similar fashion as delay line 100 shown in FIG. 1.

Latch 204 has a data output labeled "linearity[0]", which is coupled to feedback input 216 of control circuit 206. Control circuit 206 has a clock output 218 coupled to the clock input of test latch 208 and a pulse control output 220 coupled to the data input of test latch 208. Latches 204 and 208 can include any suitable latch circuit, such as D-type flip-flops. Although not shown in FIG. 2, control circuit 206 has a delay control output similar to output 114 shown in FIG. 1 for each delay line 230 of delay chain A and delay chain 0. Through these delay control outputs, control circuit 206 can program the propagation delays through each of the delay lines 230 independently of the other delay lines.

With the test structure shown in FIG. 2, control circuit 206 can generate a test pulse 232 at the output of test latch 208 for comparing the propagation delays through each of the delay chains. Pulse 232 propagates through delay chain A and delay chain 0 to signal outputs 212. Depending on the delay values programmed into chain A and chain 0 and the linearity of the unit delays being tested, pulse 232 may appear at the output 212 of one delay chain sooner than at the output 212 of the other delay chain. If delay chain A has a smaller propagation delay than delay chain 0, a logic low value will be latched in linearity latch 204. If the propagation delay through delay chain A is greater than the propagation delay through delay chain 0, latch 204 will latch a logic high value. As the delay lines 230 are programmed with different delays and subsequently tested by a test pulse 232, the values captured by latch 204 can be used by control circuit 206 to determine linearity between unit delays in chain A and unit delays in chain 0.

In one embodiment of the present invention, control circuit 206 implements a test algorithm which, for each delay line 230 in chain 0, successively programs that delay line with a sequence of successively different unit delays. For example, control circuit 206 can successively increment the delay through the delay line 230 in chain 0 that is being tested from a minimum delay to a maximum delay. The size of the increment can be any number of unit delays, such as a single unit delay. A single unit delay would be the smallest incremental delay that can be programmed into delay line 230.

For each delay setting programmed into chain 0, control circuit 206 does a sweep of chain A from a delay value less than the delay value currently programmed into chain 0 to a delay value greater than the delay value currently programmed into chain 0. This is done by successively programming the delay through one or more of the delay lines 230 in chain A to successively different delay settings in a selected sequence. In one embodiment, control circuit 206 successively increments (or decrements) the delay through chain A by a single unit delay. Any other increment step size can also be used depending on the desired accuracy of the measurement.

For each set of delay values programmed in chain 0 and chain A, control circuit 206 generates a pulse 232 on inputs 210 and reads the resulting sampled value, linearity[0], captured by latch 204. Any type of circuit can be used for generating a logic transition on inputs 210, such as the latch 208 shown in FIG. 2. Control circuit 206 can include an internal or external memory for storing each of the sampled values. In one embodiment, the set of sampled values obtained for each delay setting of chain 0 (as the delay through chain A is varied) are stored in an array for that delay setting of chain 0. This process is repeated for each of the delay settings of the delay line 230 in chain 0 that is being tested, and the overall process is repeated for each of the delay lines 230 in chain 0. Control circuit 206 can also do the sweeps of chain A using different delay lines 230 in chain A to test all of the unit delays in chain A and chain 0. The result is a plurality of arrays of stored sample values in the memory, wherein each array corresponds to a sweep of chain A for a particular delay setting in chain 0.

FIG. 3 is a table illustrating three possible arrays of captured values at the output of latch 204. In this example, the sweep of chain A was done with ten samples, five samples with chain A having a delay smaller than the expected delay through chain 0 and five samples with chain A having a delay greater than the expected delay through chain 0. Row 300 shows the number of each sample, and rows 301–303 show three separate arrays of sampled values that could be captured by latch 204 during the sweep of the delays through chain A.

Since each unit delay in chain A has the same structure as each unit delay in chain 0, there should be one delay setting in chain A that corresponds to the same propagation delay as the delay setting in chain 0. This delay setting would determine the middle of the transition window that would be expected for perfectly matched unit delays. For example, the transition may be expected to occur in sample 5 as indicated by arrow 304. However, the actual sampled value will have a transition window due to metastability and margin on the unit delays, within delay lines 230. In Array 1, the transition occurs in sample 4. In Array 2, the transition occurs in sample 5. In array 3, the transition occurs in sample 6.

Based on the particular integrated circuit design, the circuit designer can define the allowable time margin during which the transition can occur relative to the time the transition is expected to occur. For example, the circuit designer may determine that sufficient linearity exists if the transition occurs within two samples of the middle of the transition window. If the middle of the transition window is determined to be sample number 5, then an allowable transition window would include sample 3 to sample 7. Thus, a delay line would be considered to have insufficient linearity if the value at sample 2 is not low or if the value at sample 8 is not high.

Once the captured values of linearity[0] have been stored for each sweep of chain A, any suitable algorithm can be used to determine whether the transition occurs within the desired transition region.

FIG. 4 is a timing diagram illustrating the outputs of chains A and 0 as the delay through chain A is swept past the delay through chain 0. The timing shown in FIG. 4 would produce Array 2 shown in FIG. 3. Waveforms 500–505 represent the output of chain A for samples 0–5, respectively. Waveform 506 represents the output of chain 0. As the delay through chain A progressively increases with the addition of one unit delay for each sample, the delay through chain A is swept from a delay less than the delay through chain 0 to a delay greater than the delay through chain 0. Once the delay through chain A is longer than the delay through chain 0, latch 204 (shown in FIG. 2) transitions from a low state to a high state. In this case, the transition occurs in sample 5.

Due to different loads on the output of each delay chain shown in FIG. 2 during normal operation, the programmed delay control value for the delay lines in chain A can be different than the program control values for the delay lines in chain 0 for achieving the same overall propagation delay. This initial offset can be measured and then used to determine the control values that are used when sweeping the delay through chain A.

Referring back to FIG. 2, test structure 200 must be capable of sweeping the delay through chain A from a delay value less than the currently programmed delay in chain 0 to a delay greater than the delay in chain 0. This can be done by making chain A and chain 0 each include at least two serially-connected delay lines. If only two delay lines exist in an integrated circuit, these two delay lines can each be split into two delay lines connected together in series. The total delay through chain A must be greater than the delay through one of the delay lines in chain 0. With this structure, it is possible to test each unit delay of chain 0.

For example, if control circuit 206 is testing a single unit delay that corresponds to the lowest delay setting of the delay line 230 labeled "delay line 0_0" in chain 0, control circuit 206 can program delay line 0_0 to its lowest setting and program one of the other delay lines, such as delay line 0_1 to a non-minimum value. Therefore, the overall delay through delay chain 0 is greater than the minimum delay through one of the delay lines 230 in chain A. This allows the delay through chain A to be set at a smaller delay than the overall delay through chain 0. By successively programming the delays in each delay line through a selected sequence each unit delay of each delay line in chain 0 can be tested with respect to each unit delay of each delay line in chain A.

In some applications, it may not be necessary to test each and every unit delay of each and every delay line of chain 0 and chain A. Rather, statistical analysis may show that it is sufficient to test only a certain portion of the unit delays. For example, the test algorithm can be made to test every tenth unit delay. Any other subset of unit delays can be tested in alternative embodiments of the present invention.

FIG. 5 is a graph in which the delay through chain 0 is plotted on X-axis 500, and the delay through chain A is plotted on Y-axis 502. The increase in the delay through chain 0 due to the addition of one unit delay should be equal to an increase in the delay through chain A due to the addition of one unit delay plus an allowable margin. The allowable margin is user defined and is represented by the width of passing region 504. The relative location of passing region 504 can shift up or down in FIG. 5 depending on the different load conditions on the inputs and outputs of the delay lines in the chains for different circuit designs.

As mentioned above, a particular integrated circuit may have more than two delay lines. FIG. 6 shows a test structure 600 which is capable of testing multiple delay chains in parallel to save tester time. Test structure 600 includes a plurality of delay chains 602, a plurality of linearity sample latches 604, a control circuit 606 and a test latch 608. Delay chains 602 are labeled "chain A" and "chain 0" to "chain N−1", where N is any positive integer value. In one embodiment, each delay chain 602 includes two or more delay lines 100 having serially-connected unit delays 102 as shown in FIG. 1. Each chain 602 has a signal input 610 coupled to the output of test latch 608. Chain A has an output 612 which is coupled to the clock input of each latch 604. Chain 0 to chain N−1 each have an output 612 which is coupled to the data input of a respective one of the latches 604.

The data outputs latches 604 are labeled linearity[0:N−1], respectively, and are fed back to input 616 of control circuit 606. Control circuit 606 can be implemented in hardware, software or a combination of both hardware and software. For example, control circuit 606 can be implemented as a state machine or programmed computer. Although not shown in FIG. 2, control circuit 606 further includes a plurality of delay control outputs similar to output 114 shown in FIG. 1 for programming the delays through each delay line in delay chains 602.

In one embodiment of the present invention, control circuit 606 implements a test algorithm similar to the algorithm discussed with respect to FIG. 2. The algorithm successively programs the delay through each unit delay in chain 0 to chain N−1. For each programmed delay value in chain 0 to chain N−1 (equal to each unit delay), control circuit 606 does a sweep of chain A from a delay value less than the delay value being tested in chain 0 to chain N−1 to a delay value greater than the delay value being tested in chain 0 to chain N−1, while pulsing inputs 610. The resulting sample values captured on latch outputs LINEARITY[0:N−1] are stored in a memory device and analyzed by control circuit 606.

The test structures and methods described above allow the linearity of one delay line in an integrated circuit to be compared to another delay line in the integrated circuit on a unit delay basis instead of over the entire delay line where accumulated errors would otherwise be hidden.

Although the present invention has been described with reference to preferred embodiments, workers skilled in the art will recognize that changes may be made in form and detail without departing from the spirit and scope of the invention. For example the particular unit delay structures can have any suitable design and control scheme. During the test algorithm, the unit delays through each delay line can be incremented, decremented or varied in any other sequence, and any number of individual unit delays can be tested. The terms "incremented" and "decremented" are interchangeable. Any suitable algorithm can be used to analyze the sampled values captured by the linearity latch. Also, the term "coupled" used in the specification and the claims can include a direct connection or a connection through one or more intermediate components.

What is claimed is:

1. A method of testing programmable delay chains in an integrated circuit, the method comprising:

a) successively programming a first delay chain to a first sequence of delay settings;

b) for each delay setting in the first sequence, successively programming a second delay chain to a second sequence of delay settings that sweep a propagation delay through the second delay chain from a delay value less than a present propagation delay through the first delay chain to a delay value greater than the present propagation delay;

c) for each delay setting of the second delay chain in step b), applying a logic transition to inputs of the first and second delay chains and latching an output of one of the first and second delay chains as a function of an output of the other of the first and second delay chains to produce a sample value; and d) for each delay setting in the first sequence, determining whether the logic transition occurs in the sample values produced in step c) within an expected time window.

2. The method of claim 1 wherein step c) comprises for each delay setting in the first sequence, storing the sample values produced in step c) as an array for that delay setting in a memory device.

3. The method of claim 2 wherein step d) comprises:

d) 1) defining a range of the sample values stored in the array, which corresponds to the expected time window; and d) 2) determining whether the logic transition occurs within the range of the sample values.

4. The method of claim 3 wherein the logic transition at the output of the delay chain that is latched transitions from a first logic value to a second logic value and wherein step d) 2) comprises determining whether the sample value in the array that immediately precedes the range in time has the first logic value and whether the sample value in the array that immediately succeeds the range in time has the second logic value.

5. The method of claim 1 wherein the first and second delay chains are each formed of a plurality of unit delays which are coupled together in series and wherein the method further comprises defining each of the unit delays in the first and second delay chains to have the same physical layout on the integrated circuit.

6. The method of claim 5 wherein the first and second delay chains each comprises at least two delay lines coupled together in series, wherein each delay line comprises at least two of the unit delays and has a propagation delay that is programmable in steps a) and b) independently of the propagation delays of the other delay lines in that chain.

7. The method of claim 6 wherein step a) comprises, for each delay line in the first delay chain, successively programming that delay line to the first sequence of delay settings.

8. The method of claim 7 wherein step b) comprises for each delay setting in step a) for a particular delay line in the first delay chain, successively programming at least one of the delay lines in the second delay chain to the second sequence of delay settings.

9. The method of claim 8 wherein step b) further comprises varying the delay line in the second delay chain that is successively programmed in step b) for different ones of the delay lines that are successively programmed in step a).

10. The method of claim 5 wherein step a) comprises of successively incrementing the propagation delay though the first delay line by a delay through a single one of the unit delays in the first delay chain.

11. The method of claim 5 wherein step b) comprises of successively incrementing the propagation delay though the second delay line by a delay through one of the unit delays in the second delay chain.

12. The method of claim 11 wherein the delay through one of the unit delays is the smallest incremental delay that can be programmed into the second delay chain.

13. A delay line linearity test structure fabricated in an integrated circuit, comprising:
- first and second delay chains, wherein each delay line is programmable to a plurality of different delay settings and includes a signal input and a signal output;
- a latch having a data input coupled to the output of one of the first and second delay lines, a latch control coupled to the output of the other of the first and second delay lines, and a latch output;
- a control circuit for:
  a) successively programming the first delay chain to a first sequence of the delay settings;
  b) for each delay setting in the first sequence, successively programming the second delay chain to a second sequence of the delay settings that sweep a propagation delay through the second delay chain from a delay value less than a present propagation delay through the first delay chain to a delay value greater than the present propagation delay;
- a logic transition generator which applies a logic transition to the inputs of the first and second delay chains for each of the delay settings of the first and second delay chains;
- a memory coupled to the latch output for storing a sample value produced on the latch output in response to the logic transition for each delay setting of the second delay chain; and
- wherein the control circuit determines whether the logic transition occurs within an expected time window in the sample values stored in the memory for each delay setting in the first sequence.

14. The delay line linearity test structure of claim 13 wherein the memory stores the sample values produced on the latch output for each delay setting in the first sequence as an array for that delay setting.

15. The delay line linearity test structure of claim 14 wherein the control circuit comprises means for defining a range of the sample values stored in the array, which corresponds to the expected time window and for determining whether the logic transition occurs within the range of the sample values.

16. The delay line linearity test structure of claim 15 wherein the logic transition at the output of the delay chain that is latched transitions from a first logic value to a second logic value and wherein the control circuit comprises means for determining whether the sample value in the array that immediately precedes the range in time has the first logic value and whether the sample value in the array that immediately succeeds the range in time has the second logic value.

17. The delay line linearity test structure of claim 13 wherein the first and second delay chains are each formed of a plurality of unit delays which are coupled together in series and wherein each of the unit delays in the first and second delay chains to have the same physical layout on the integrated circuit.

18. The delay line linearity test structure of claim 17 wherein the first and second delay chains each comprises at least two delay lines coupled together in series, wherein each delay line comprises at least two of the unit delays and has a propagation delay that is programmable independently of the propagation delays of the other delay lines in that chain.

19. A delay line linearity test structure fabricated in an integrated circuit, comprising:
- first and second delay chains, wherein each delay line is programmable to a plurality of different delay settings and includes a signal input and a signal output;
- means for successively programming the first delay chain to a first sequence of the delay settings;
- means for successively programming the second delay chain to a second sequence of the delay settings that sweep a propagation delay through the second delay chain from a delay value less than a present propagation delay through the first delay chain to a delay value greater than the present propagation delay, for each delay setting in the first sequence;
- means for applying a logic transition to the signal inputs of the first and second delay chains and latching the signal output of one of the first and second delay chains as a function of the signal output of the other of the first and second delay chains to produce a sample value, for each delay setting of the second delay chain; and
- means for determining whether the logic transition occurs within an expected time window in the sample values produced for each delay setting in the first sequence.

* * * * *